United States Patent
Itoi

(10) Patent No.: US 6,477,209 B1
(45) Date of Patent: Nov. 5, 2002

(54) METHOD FOR ENCODING AND DECODING RECORDING CODES AND METHOD FOR INSERTING SYNCHRONIZATION SIGNALS

(75) Inventor: Satoshi Itoi, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/333,740

(22) Filed: Jun. 15, 1999

(30) Foreign Application Priority Data

Jun. 17, 1998 (JP) .......................................... 10-168856

(51) Int. Cl.7 .............................................. H04L 25/34
(52) U.S. Cl. ...................................................... 375/292
(58) Field of Search ............................ 375/292; 360/40, 360/48, 55; 369/59, 124.04, 124.08, 272, 275.3

(56) References Cited

U.S. PATENT DOCUMENTS 5,388,093 A * 2/1995 Yoshida et al. ............. 369/124
5,729,517 A * 3/1998 Fujiwara et al. .............. 369/59
5,850,382 A * 12/1998 Koishi et al. ............. 369/275.3

FOREIGN PATENT DOCUMENTS

| JP | 63-94719 | 4/1988 |
| JP | 4-302865 | 10/1992 |
| JP | 5-159462 | 6/1993 |
| JP | 5-314661 | 11/1993 |
| JP | 6-195893 | 7/1994 |
| JP | 6-197024 | 7/1994 |
| JP | 8-7492 | 1/1996 |
| JP | 8-223047 | 8/1996 |
| JP | 8-274645 | 10/1996 |
| JP | 10-149635 | 6/1998 |

* cited by examiner

Primary Examiner—Don N. Vo
(74) Attorney, Agent, or Firm—Hayes Soloway PC

(57) ABSTRACT

A method for encoding data bits into channel bits used for recording digital data onto a recording medium or for transmitting digital data via a transmission system. Channel bits "00X", "010" and "10X" are allotted to 3 patterns of data bits among 4 patterns of data bits having 2 bits, where X designates an indefinite bit which becomes "1" when the channel bit succeeding the indefinite bit is "0" and becomes "0" when the channel bit succeeding the indefinite bit is "1". Channel bits "000010", "00000X", "100010" and "10000X" are allotted to 4 patterns of data bits having 4 bits which are a combination of two bits having a remaining one pattern among the 4 patterns of the data bits having 2 bits and additional two bits. Channel bits "100000010" as a special pattern are allotted to data bits having 6 bits which are the continuation of alternate 3 patterns of data bits to be encoded to channel bits "010" and data bits to be encoded to channel bits "10X".

17 Claims, 11 Drawing Sheets

| CONTENTS | DATA BITS | CHANNEL BITS |
|---|---|---|
| ORDINARY | 0 0 | 0 0 × |
| | 0 1 | 0 1 0 |
| | 1 0 | 1 0 × |
| | 1 1 0 0 | 0 0 0 0 1 0 |
| | 1 1 0 1 | 0 0 0 0 0 × |
| | 1 1 1 0 | 1 0 0 0 1 0 |
| | 1 1 1 1 | 1 0 0 0 0 × |
| SPECIAL | 1 0 0 1 1 0 | 1 0 0 0 0 0 0 1 0 |

×: WHEN NEXT CHANNEL BIT IS 0, ×=1,
WHEN NEXT CHANNEL BIT IS 1, ×=0.

FIG. 1

| CONTENTS | DATA BITS | CHANNEL BITS |
|---|---|---|
| ORDINARY | 0 0 | 0 0 × |
| | 0 1 | 0 1 0 |
| | 1 0 | 1 0 × |
| | 1 1 0 0 | 0 0 0 0 1 0 |
| | 1 1 0 1 | 0 0 0 0 0 × |
| | 1 1 1 0 | 1 0 0 0 1 0 |
| | 1 1 1 1 | 1 0 0 0 0 × |
| SPECIAL | 1 0 0 1 1 0 | 1 0 0 0 0 0 0 1 0 |

×: WHEN NEXT CHANNEL BIT IS 0, ×=1,
  WHEN NEXT CHANNEL BIT IS 1, ×=0.

FIG. 2

| ri | DATA BITS | CHANNEL BITS | ro |
|---|---|---|---|
| 0 | 0 0 ( 0 , 1 1 0 )<br>0 0 ( 1 0 , 1 1 1 )<br>0 1<br>1 0 ( 0 0 , 0 1 0 , 0 1 1 1 , 1 1 0 )<br>1 0 ( 0 1 1 0 )<br>1 0 ( 1 0 , 1 1 1 )<br>1 1 ( 0 )<br>1 1 ( 1 ) | 0 0 1<br>0 0 0<br>0 1 0<br>1 0 1<br>1 0 0<br>1 0 0<br>0 0 0<br>1 0 0 | 0<br>0<br>0<br>0<br>1<br>0<br>1<br>1 |
| 1 | 0 0<br>( 1 ) 0 1 ( 0 , 1 1 0 )<br>( 1 ) 0 1 ( 1 0 , 1 1 1 )<br>( 0 ) 0 1<br>1 0<br>1 1 ( 0 , 1 1 0 )<br>1 1 ( 1 0 , 1 1 1 ) | 0 1 0<br>0 0 1<br>0 0 0<br>0 0 0<br>0 1 0<br>0 0 1<br>0 0 0 | 0<br>0<br>0<br>2<br>0<br>0<br>0 |
| 2 | 1 0 | 0 1 0 | 0 |

FIG. 3

| CHANNEL BITS | DATA BITS |
|---|---|
| 0 0 0 ( 0 0 ) <br> ( 1 ) 0 0 0 ( 0 1 ) <br> ( 1 0 ) 0 0 0 ( 0 1 ) <br> ( 1 0 0 ) 0 0 0 ( 0 1 ) <br> ( 1 ) 0 0 0 ( 1 ) <br> ( 1 0 ) 0 0 0 ( 1 ) <br> ( 0 0 0 ) 0 0 0 ( 1 ) <br> ( 1 0 0 ) 0 0 0 ( 1 ) | 1 1 <br> 1 1 <br> 1 1 <br> 0 1 <br> 0 0 <br> 0 0 <br> 0 1 <br> 1 1 |
| ( 1 ) 0 0 1 <br> ( 1 0 ) 0 0 1 <br> ( 0 0 0 ) 0 0 1 <br> ( 1 0 0 ) 0 0 1 | 0 0 <br> 0 0 <br> 0 1 <br> 1 1 |
| ( 1 ) 0 1 0 <br> ( 1 0 ) 0 1 0 <br> ( 1 0 0 ) 0 1 0 <br> ( 1 0 0 0 ) 0 1 0 <br> ( 1 0 0 0 0 ) 0 1 0 <br> ( 1 0 0 0 0 0 ) 0 1 0 | 0 1 <br> 0 1 <br> 1 0 <br> 0 0 <br> 0 0 <br> 1 0 |
| 1 0 0 ( 0 1 ) <br> 1 0 0 ( 0 0 1 ) <br> 1 0 0 ( 0 0 0 1 ) <br> 1 0 0 ( 0 0 0 0 1 ) | 1 1 <br> 1 1 <br> 1 1 <br> 1 0 |
| 1 0 1 | 1 0 |
| OTHER VALUES (VIOLATION CODES) | 1 1 |

FIG. 8

| CONTENTS | DATA BITS | CHANNEL BITS | |
| --- | --- | --- | --- |
| | | TABLE A | TABLE B |
| ORDINARY | 0 0 | 0 0 × | ← |
| | 0 1 | 0 1 0 | ← |
| | 1 0 | 1 0 × | ← |
| | 1 1 0 0 | 0 0 0 0 1 0 | ← |
| | 1 1 0 1 | 0 0 0 0 0 × | ← |
| | 1 1 1 0 | 1 0 0 0 1 0 | ← |
| | 1 1 1 1 | 1 0 0 0 0 × | ← |
| SPECIAL | 1 0 0 1 1 0 | 0 0 0 0 0 0 0 1 0 | 1 0 0 0 0 0 0 1 0 |

× : WHEN NEXT CHANNEL BIT IS 0, ×=1,
WHEN NEXT CHANNEL BIT IS 1, ×=0.

FIG. 9

| CONTENTS | DATA BITS | CHANNEL BITS | |
| --- | --- | --- | --- |
| | | TABLE A | TABLE B |
| ORDINARY | 0 0 | 0 0 × | ← |
| | 0 1 | 0 1 0 | ← |
| | 1 0 | 1 0 × | ← |
| | 1 1 0 0 | 0 0 0 0 1 0 | 1 0 0 0 1 0 |
| | 1 1 0 1 | 0 0 0 0 0 × | ← |
| | 1 1 1 0 | 1 0 0 0 0 × | ← |
| | 1 1 1 1 0 0 | 0 0 0 0 0 0 0 1 0 | ← |
| | 1 1 1 1 0 1 | 0 0 0 0 0 0 0 0 × | ← |
| | 1 1 1 1 1 0 | 1 0 0 0 0 0 0 1 0 | ← |
| | 1 1 1 1 1 1 | 1 0 0 0 0 0 0 0 × | ← |

×: WHEN NEXT CHANNEL BIT IS 0, ×=1,
 WHEN NEXT CHANNEL BIT IS 1, ×=0.

FIG. 10

| CONTENTS | DATA BITS | CHANNEL BITS | | | |
|---|---|---|---|---|---|
| | | TABLE A | TABLE B | TABLE C | TABLE D |
| ORDINARY | 00 | 00x | ↓ | ↓ | ↓ |
| | 01 | 010 | ↓ | ↓ | ↓ |
| | 10 | 10x | ↓ | ↓ | ↓ |
| | 1100 | 000010 | ↓ | ↓ | ↓ |
| | 1101 | 00000x | ↓ | ↓ | ↓ |
| | 1110 | 100010 | ↓ | ↓ | ↓ |
| | 1111 | 10000x | ↓ | ↓ | ↓ |
| SPECIAL | 100110 | 00000010 | 00000000x | 10000010 | 10000000x | x: WHEN NEXT CHANNEL BIT IS 0, x=1,
　　WHEN NEXT CHANNEL BIT IS 1, x=0.

FIG. 11

| DATA BITS | CHANNEL BITS |
|---|---|
| 0 0 | 0 0 x |
| 0 1 | 0 1 0 |
| 1 0 | 1 0 x |
| 1 1 0 0 | 0 0 0 0 1 0 |
| 1 1 0 1 | 0 0 0 0 0 x |
| 1 1 1 0 | 1 0 0 0 1 0 |
| 1 1 1 1 | 1 0 0 0 0 x | x : WHEN NEXT CHANNEL BIT IS 0, x=1,
WHEN NEXT CHANNEL BIT IS 1, x=0.

PRIOR ART

METHOD FOR ENCODING AND DECODING RECORDING CODES AND METHOD FOR INSERTING SYNCHRONIZATION SIGNALS

FIELD OF THE INVENTION

The present invention relates generally to code conversion, and more particularly to conversion of recording codes which are used when digital data is recorded in a digital VTR, an optical disc storage, a magnetic disc storage and the like or which are used when digital data is transmitted via a transmission system.

BACKGROUND OF THE INVENTION

When digital data is recorded onto a recording medium in high density, or transmitted via any transmission system, (1, 7) code is conventionally used. FIG. 11 shows an example of a conventional (1, 7) code conversion rule table.

This (1, 7) code conversion rule table includes 7 kinds of correspondence relations between data bits and channel bits, and shows that the following code conversion is performed. That is, data bits "00" are converted to channel bits "00X", and, similarly, "01" are converted to "010", "10" are converted to "10X", "1100" are converted to "000010", "1101" are converted to "00000X", "1110" are converted to "100010", and "1111" are converted to "10000X". In this rule table, a symbol X designates an indefinite bit, and becomes "1" when the next channel bit following the indefinite bit is "0" and becomes "0" when the next channel bit following the indefinite bit is "1". Also, recording or transmission of the (1, 7) code data is performed by using NRZI signal system. That is, the channel bits are sequentially disposed and "1" is converted to inversion of a signal and "0" is converted to non-inversion of the signal to record or transmit them.

The conventional (1, 7) recording code has the following characteristics. That is, at channel bit level, number of "0" existing between "1" and adjacent "1" is equal to or larger than 1 and equal to or smaller than 7. Therefore, when digital data is recorded and reproduced by using NRZI signal system, number of non-inversion bits existing between adjacent inversion bits can be equal to or larger than 1 bit and equal to or smaller than 7 bits. Thus, when a clock period of a signal after modulation or encoding is Ts, minimum interval between inversions becomes 2Ts and maximum interval between inversions becomes 8Ts. In practice, however, original bit number is multiplied by 1.5, because data bits having, for example, 2 bits are converted into channel bits having 3 bits. Therefore, with respect to a period Tb before modulation, timing relation becomes as follows.

Tmin=1.33Tb (minimum interval between inversions)
Tmax=5.33Tb (maximum interval between inversions)
Twin=0.67Tb (width of detection window)

The (1, 7) code has the characteristics mentioned above, and parameters Tmin, Twin, Tmin*Twin are relatively large so that a recording system using the (1, 7) code is suitable for high density recording. However, the conventional (1, 7) code has the following disadvantages.

In case code conversion is performed according to the (1, 7) code conversion rule table shown in FIG. 11, consider a condition in which data bits "10" and data bits "01" are alternately supplied. That is, data

"1001100110011001 . . . "

is continuously inputted. In this case, channel bits become a repetition of "1" and "0". That is, the channel bits become as follows.

"101010101010101010101010 . . . "

This is a continuation of 2Ts patterns. Continuation of the 2Ts patterns is a pattern having maximum repetition frequency in the (1, 7) codes. If the 2Ts patterns continue in a data reproducing system, a signal level of a reproduced data reduces and a PLL (phase-locked loop) circuit used in the reproducing system tends to be out of synchronization. Therefore, it is necessary to avoid continuous occurrence of the 2Ts patterns for a long time as much as possible. However, in the conventional (1, 7) code, such continuous occurrence of the 2Ts patterns was inevitable.

In order to reduce bad influence of out of synchronization of the PLL circuit to minimum, conventionally, there is known a technique of periodically inserting a re-synchronizing signals into a recording data. For example, see Japanese patent laid-open publication No. 6-195893. However, since this technique is not a technique for avoiding occurrence of 2Ts patterns continuously for a long time, there was a problem that, depending on the locations of insertion of the re-synchronizing signals, the 2Ts patterns were produced continuously for a long time, thereby causing out of synchronization of the PLL circuit.

SUMMARY OF THE INVENTION

Therefore, it is an object of the present invention to obviate disadvantages of the conventional recording codes.

It is another object of the present invention to avoid continuous and long time occurrence of 2Ts patterns in recording codes.

It is still another object of the present invention to realize stable operation of a PLL circuit when reproducing digital data recorded onto a recording medium or transmitted via a transmission system.

It is still another object of the present invention to effectively decrease DC component of recording codes and to reduce bad influence caused by signal jittering.

It is still another object of the present invention to improve reliability of digital data storage or digital data transmission.

According to an aspect of the present invention, there is provided a method for encoding recording codes wherein data bits are encoded into channel bits. The method comprises: allotting respective channel bits "00X", "010" and "10X" to 3 patterns of data bits among 4 patterns of data bits having 2 bits, where X designates an indefinite bit which becomes "1" when the channel bit succeeding the indefinite bit is "0" and becomes "0" when the channel bit succeeding the indefinite bit is "1" ; allotting channel bits "000010", "00000X", "100010" and "10000X" to 4 patterns of data bits having 4 bits which are a combination of two bits having a remaining one pattern among the 4 pattern of the data bits having 2 bits and additional two bits; and allotting channel bits "100000010" as a special pattern to data bits having 6 bits which are the continuation of alternate 3 patterns of data bits to be encoded to channel bits "010" and data bits to be encoded to channel bits "10X".

According to another aspect of the present invention, there is provided a method for decoding channel bits encoded by the method mentioned above. In this method, from channel bits to be decoded having 3 bits, channel bits having 6 bits preceding the channel bits to be decoded and channel bits having 5 bits succeeding the channel bits to be decoded, decoded data bits having 2 bits are obtained.

According to still another aspect of the present invention, there is provided a method for encoding recording codes wherein data bits are encoded into channel bits. This method comprises: allotting respective channel bits "00X", "010" and "10X" to 3 patterns of data bits among 4 pattern of data bits having 2 bits, where X designates an indefinite bit which becomes "1" when the channel bit succeeding the indefinite bit is "0" and becomes "0" when the channel bit succeeding the indefinite bit is "1"; allotting channel bits "000010", "00000X", "100010" and "10000X" to 4 pattern of data bits having 4 bits which are a combination of two bits having a remaining one pattern among said 4 pattern of the data bits having 2 bits and additional two bits; and allotting channel bits "000000010" or "100000010" as a special pattern to data bits having 6 bits which are the continuation of alternate 3 patterns of data bits to be encoded to channel bits "010" and data bits to be encoded to channel bits "10X", one of the channel bits "000000010" and "100000010" being selected according to a predetermined criterion. By this method, DC component of the recording codes can be further decreased and bad influence by signal jittering can be reduced.

According to still another aspect of the present invention, when, for example, DC component of an encoded digital signal is to be removed, it is possible to select one pattern of channel bits, such that DSV (Digital Sum Value) of an encoded data is minimized, among a plurality patterns of channel bits allotted to one kind of data bits. Also, in order to remove DC component and to enhance immunity against signal jittering, it is possible to select one pattern of channel bits such that DSV of an encoded data is minimized, while satisfying limitation of maximum interval between inversions.

According to still another aspect of the present invention, there is provided a method for inserting synchronization signals into a series of data bits encoded by the method as mentioned above. In the method, a synchronization signal which includes a bit pattern "10000000100000001", which ends with "010" and which starts from "010" is inserted into the series of data bits.

According to still another aspect of the present invention, there is provided a method for inserting synchronization signals, by which method, it is possible to surely determine the number of the synchronization signal block in a sector of recording codes when the sector comprises a plurality of synchronization signal blocks each including data signal and a synchronization signal. In this method, synchronization signals having different patterns are inserted into respective synchronization signal blocks of the plurality of synchronization signal blocks.

According to still another aspect of the present invention, there is provided a method for inserting synchronization signals by which DC component can be removed. In this method, a plurality of synchronization signals having predetermined different patterns are prepared and, when a synchronization signal is inserted into a synchronization signal block, the synchronization signal is selected so as to minimize DSV of the synchronization signal block.

According to still another aspect of the present invention, there is provided a method for inserting synchronization signals by which DC component can be reduced and immunity against signal jittering can be improved. In this method, when a sector of recording codes comprises a plurality of synchronization signal blocks each including data signal and a synchronization signal, a plurality of synchronization signals having predetermined different patterns are prepared corresponding to each synchronization signal block, and, when a synchronization signal is inserted into a synchronization signal block, the synchronization signal is selected so as to minimize DSV of the synchronization signal block among the plurality of synchronization signals prepared for the synchronization signal block.

BRIEF DESCRIPTION OF THE DRAWINGS

FIG. 1 is an illustration of a conversion rule table showing a code conversion rule in accordance with an embodiment of the present invention;

FIG. 2 is an illustration showing a conversion table used for implementing practical code conversion according to the conversion rule shown in FIG. 1;

FIG. 3 is an illustration showing a reverse-conversion table used for implementing decode of channel codes encoded according to the code conversion rule shown in FIG. 1;

FIG. 8 is an illustration of a conversion rule table showing a code conversion rule in accordance with another embodiment of the present invention;

FIG. 9 is an illustration of a conversion rule table showing a code conversion rule in accordance with still another embodiment of the present invention;

FIG. 10 is an illustration of a conversion rule table showing a code conversion rule in accordance with still another embodiment of the present invention; and FIG. 11 is an illustration showing a conventional code conversion rule table.

DESCRIPTION OF A PREFERRED EMBODIMENT

Figure 4:
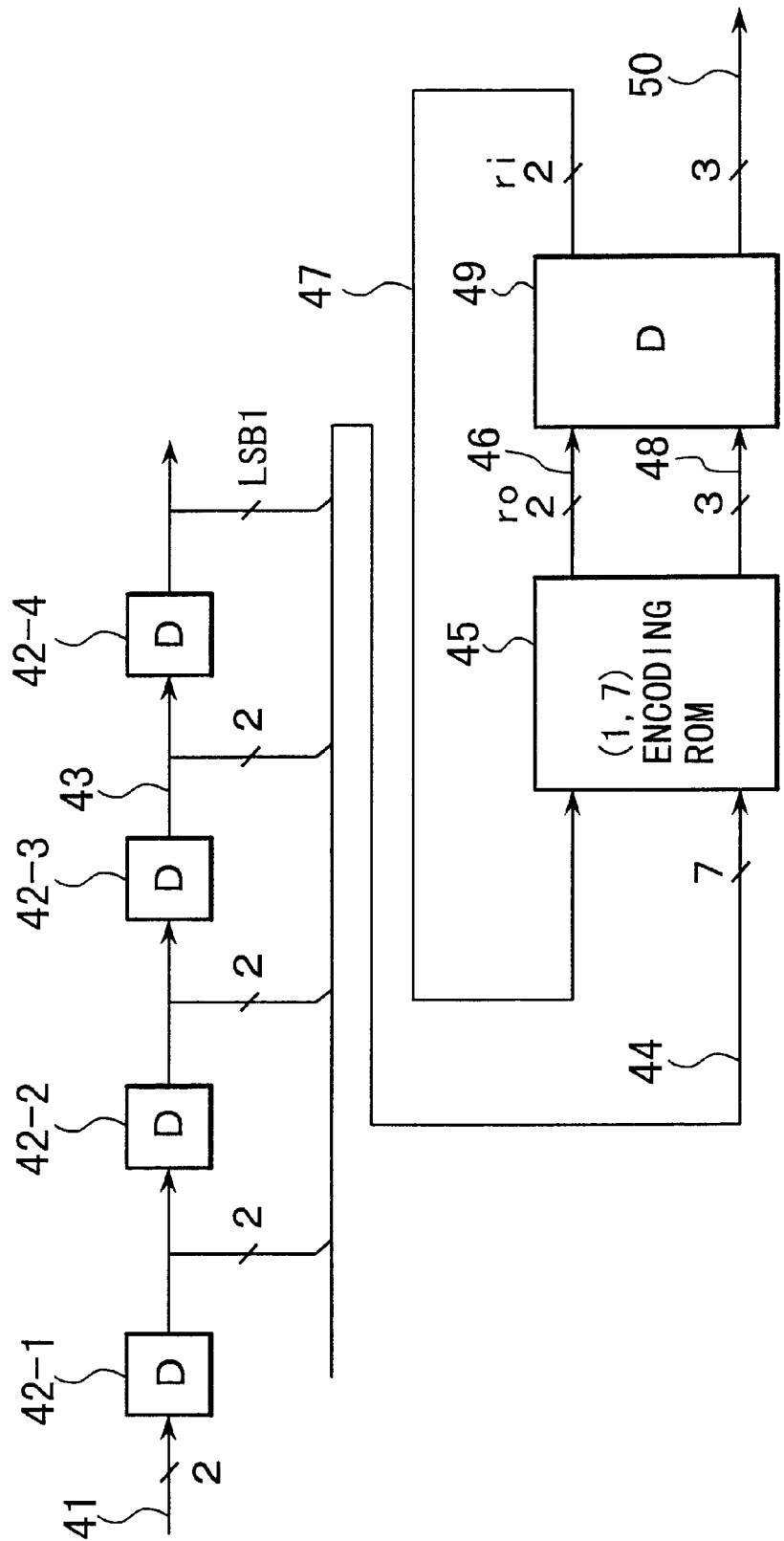
FIG. 4 is a block diagram showing an example of a structure of a (1, 7) encoding circuit.

With reference to the attached drawings, embodiments of the present invention will now be explained in detail.

FIG. 1 shows an example of a recording code conversion rule table used in an embodiment of the present invention. The recording code conversion rule table shown in FIG. 1 is composed of an ordinary conversion table and a special conversion table. The ordinary conversion table has 7 kinds of correspondence relations between data bits and channel bits. The ordinary conversion table shows that data bits "00" is converted to channel bits "00X", and, similarly, "01" is converted to "010", "10" is converted to "10X", "1100" is converted to "000010", "1101" is converted to "00000X", "1110" is converted to "100010", "1111" is converted to "10000X". Here, symbol "X" designates an indefinite bit which becomes "1" when the next channel bit succeeding the indefinite bit is "0", and becomes "0" when the next channel bit succeeding the indefinite bit is "1".

In this case, if data bits "10" and "01", which are encoded to channel bits "10X" and "010", respectively, are continuously and alternately generated, the channel bits obtained from such data bits by conversion become "101010 . . . " which is an alternate pattern of "1" and "0". This pattern is a continuation of "2T patterns", and has the maximum repetition frequency in (1, 7) codes. If 2T patterns continue, a reproduction signal level decreases and the PLL circuit tends to very easily become out of synchronization.

Therefore, long time continuation of the 2T patterns must be avoided. In the present invention, the above-mentioned special conversion table is provided in the recording code conversion rule table, and channel bits "100000010" are specially allotted to the data bit "100110". Thereby, the maximum number of repetition of the 2T patterns is six (6) when data bits are "00", "01", "10", "01", "1110". That is, these data bits are converted to channel bits "001", "010", "101", "010", "100010", and number of repetition of "10" in these channel bits is six. Recording or transmission of channel bits is performed by using NRZI signal system. That is, channel bits to be recorded or transmitted are continuously disposed as a series of bits, and when a channel bit in the series is "1", a recording or transmission signal is inverted, and when a channel bit in the series is "0", the recording or transmission signal is not inverted.

FIG. 2 illustrates an example of a code conversion table used for implementing practical code conversion shown in the code conversion rule table of FIG. 1.

In the code conversion table of FIG. 2, data bits to be encoded are partitioned into data bit groups each including two bits, and two bits each are allotted to three channel bits. Here, parameters, i.e., bit position flags are used to indicate position of two bits within the data bits. That is, the bit position flags indicate that respective two bits are first and second bits, third and fourth bits, or fifth and sixth bits in FIG. 1. The bit position flags are designated as ri and ro. The flag ri is a bit position flag before code conversion, i.e., a bit position flag used when encoding data bits, and the flag ro is a bit position flag after code conversion, i.e., a bit position flag obtained after encoding data bits and used when encoding next data bits.

The first line in the content of the table of FIG. 2 shows that, when the bit position flag ri=0, data bits "00" are converted to channel bits "001", if the next data bit or bits following the data bits "00" are "0" or "110", and that the bit position flag after conversion becomes ro=0.

Similarly, when ri=0, data bits "00" are converted to channel bits "000", if the next data bits following the data bits "00" are "10" or "111", and the flag ro becomes ro=0.

Data bits "01" are converted to channel bits "010", and the flag ro becomes ro=0.

Data bits "10" are converted to channel bits "101", if the next data bits following the data bits "10" are "00", "010", "0111" or "110", and the flag ro becomes ro=0.

Data bits "10" are converted to channel bits "100", if the next data bits following the data bits "10" are "0110", and the flag ro becomes ro=1.

Data bits "10" are converted to channel bits "100", if the next data bits following the data bits "10" are "10" or "111", and the flag ro becomes ro=0.

Data bits "11" are converted to channel bits "000", if the next data bit following the data bits "11" is "0", and the flag ro becomes ro=1.

Data bits "11" are converted to channel bits "100", if the next data bit following the data bits "11" is "1", and the flag ro becomes ro=1.

Also, when the bit position flag ri=1, data bits "00" are converted to channel bits "010", and the bit position flag after conversion ro becomes ro=0.

Data bits "01" are converted to channel bits "001", if the previous bit preceding the data bits "01" is "1" and the next data bit succeeding the data bits "01" are "0" or "110", and the flag ro becomes ro=0.

Data bits "01" are converted to channel bits "000", if the previous bit preceding the data bits "01" is "1" and the next data bit succeeding the data bits "01" are "10" or "111", and the flag ro becomes ro=0.

Data bits "01" are converted to channel bits "000", if the previous bit preceding the data bits "01" is "0", and the flag ro becomes ro=2.

Data bits "10" are converted to channel bits "010", and the flag ro becomes ro=0.

Data bits "11" are converted to channel bits "001", if the next data bit succeeding the data bits "11" are "0" or "110", and the flag ro becomes ro=0.

Data bits "11" are converted to channel bits "000", if the next data bit succeeding the data bits "11" are "10" or "111", and the flag ro becomes ro=0.

When the bit position flag ri=2, data bits "10" are converted to channel bits "010", and the flag ro becomes ro=0.

FIG. 3 illustrates an example of a decoding table, that is, a reverse conversion table, used for implementing decode or demodulation of channel bits produced in accordance with the code conversion rule table of FIG. 1.

The decode shown in the table of FIG. 3 is performed on every three channel bits. That is, channel bits are sequentially divided into channel bit groups each including three bits and each group of three channel bits is converted to data bits having 2 bits in accordance with the table of FIG. 3.

The first line in the content of the table of FIG. 3 shows that channel bits "000" are decoded into data bits "11", if the next channel bits following the channel bits "000" are "00".

Similarly, channel bits "000" are decoded into data bit "11", if the previous bit preceding the channel bits "000" is "1" and the next channel bits following the channel bits "000" are "01".

Channel bits "000" are decoded into data bit "11", if the previous bits preceding the channel bits "000" are "10" and the next channel bits following the channel bits "000" are "01".

Channel bits "000" are decoded into data bit "01", if the previous bits preceding the channel bits "000" are "100" and the next channel bits following the channel bits "000" are "01".

Channel bits "000" are decoded into data bit "00", if the previous bit preceding the channel bits "000" is "1" and the next channel bit following the channel bits "000" is "1".

Channel bits "000" are decoded into data bit "00", if the previous bits preceding the channel bits "000" are "10" and the next channel bit following the channel bits "000" is "1".

Channel bits "000" are decoded into data bit "01", if the previous bits preceding the channel bits "000" are "000" and the next channel bit following the channel bits "000" is "1".

Channel bits "000" are decoded into data bit "11", if the previous bits preceding the channel bits "000" are "100" and the next channel bit following the channel bits "000" is "1".

Also, channel bits "001" are decoded into "00", if the previous bit preceding the channel bits "001" is "1".

Channel bits "001" are decoded into "00", if the previous bits preceding the channel bits "001" are "10".

Channel bits "001" are decoded into "01", if the previous bits preceding the channel bits "001" are "000".

Channel bits "001" are decoded into "11", if the previous bits preceding the channel bits "001" are "100".

Further, channel bits "010" are decoded into "01", if the previous bit preceding the channel bits "010" is "1".

Channel bits "010" are decoded into "01", if the previous bits preceding the channel bits "010" are "10".

Channel bits "010" are decoded into "10", if the previous bits preceding the channel bits "010" are "100".

Channel bits "010" are decoded into "00", if the previous bits preceding the channel bits "010" are "1000".

Channel bits "010" are decoded into "00", if the previous bits preceding the channel bits "010" are "10000".

Channel bits "010" are decoded into "10", if the previous bits preceding the channel bits "010" are "100000".

Also, channel bits "100" are decoded into "11", if the next bits following the channel bits "100" are "01".

Channel bits "100" are decoded into "11", if the next bits following the channel bits "100" are "001".

Channel bits "100" are decoded into "11", if the next bits following the channel bits "100" are "0001".

Channel bits "100" are decoded into "10", if the next bits following the channel bits "100" are "00001".

Further, channel bits "101" are decoded into data bits "10".

If the channel bits have values other than those described above, the channel bits are judged as a violated code and decoded into data bits "11".

FIG. 4 through FIG. 7B illustrate examples of practical circuits for realizing conversion and reverse conversion operation according to FIG. 2 and FIG. 3, respectively.

In particular, FIG. 4 and FIGS. 5A through 5C are block circuit diagrams illustrating an example of a structure of a (1, 7) encoding circuit for performing code conversion according to FIG. 2.

The circuit of FIG. 4 comprises D-type flip-flop sections 42-1, 42-2, 42-3 and 42-4 serially connected to constitute a serial-parallel conversion circuit. The circuit of FIG. 4 further comprises a (1, 7) encoding ROM 45 and another D-type flip-flop section 49. The (1, 7) encoding ROM 45 stores conversion data necessary to perform code conversion shown in FIG. 2.

Figure 5A:
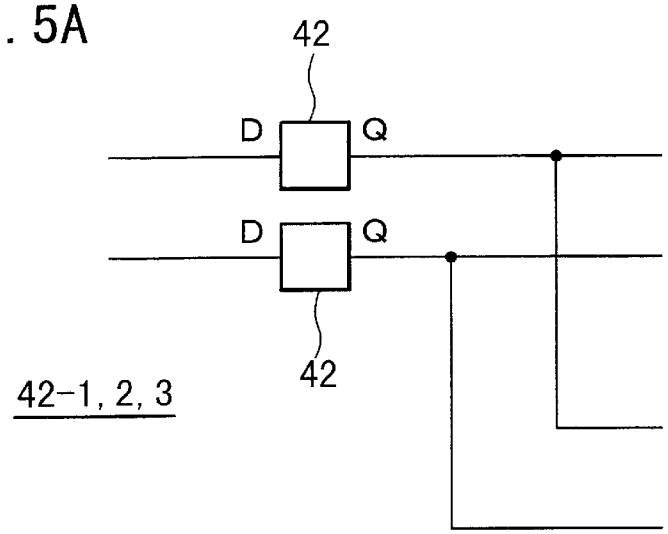
FIG. 5A through FIG. 5C are circuit diagrams each showing a detailed structure of a D-type flip-flop section used in the circuit of FIG. 4.
Figure 5B:
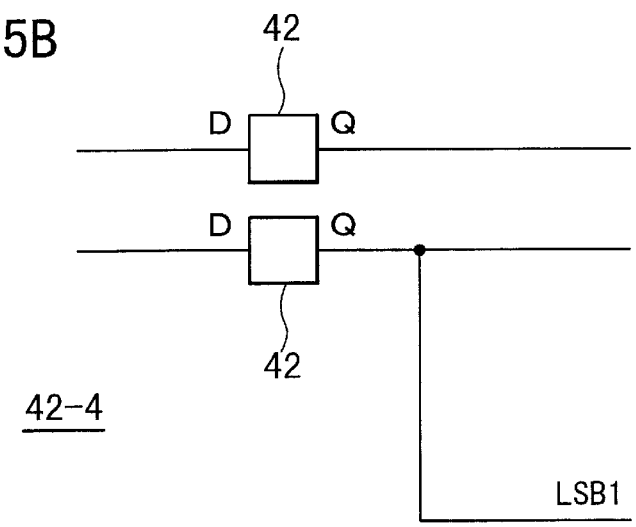
Figure 5C:
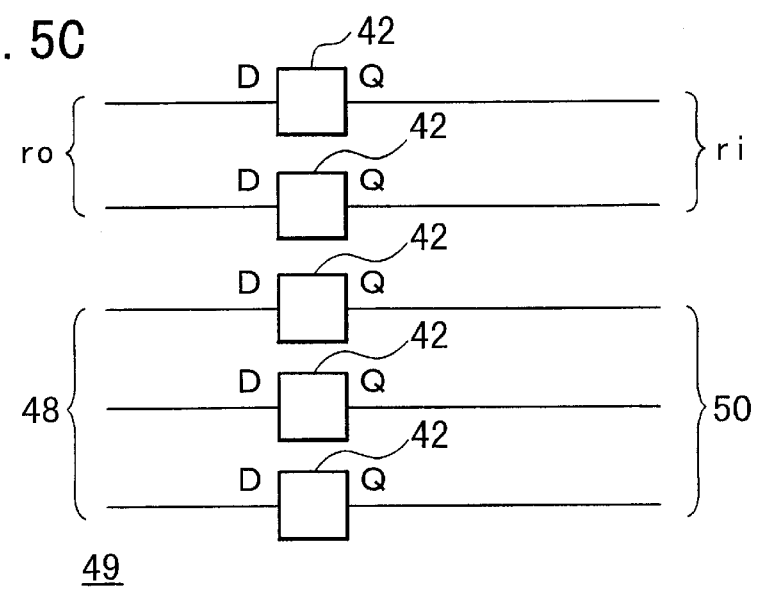

FIGS. 5A through 5C illustrate examples of detailed circuit structures of the D-type flip-flop sections used in the circuit of FIG. 4. As shown in FIG. 5A, each of the D-type flip-flop sections 42-1, 42-2 and 42-3 comprises two D-type flip-flops 42 disposed parallel to handle 2 bits data. Each of the D-type flip-flops 42 receives an input signal at a data terminal D and latches the input signal based on a clock signal not shown in the drawing, as is well known in the art. The output signals from output terminals Q of both D-type flip-flops 42 are supplied to the D-type flip-flop section of the next stage and to the (1, 7) encoding ROM 45 via signal lines 44. As shown in FIG. 5B, the D-type flip-flop section 42-4 has the same structure as that of each of the D-type flip-flop sections 42-1, 42-2 and 42-3, except that only one of the output signals from the two output terminals Q is supplied to the (1, 7) encoding ROM 45 as LSB1. As shown in FIG. 5C, the D-type flip-flop section 49 is composed of five D-type flip-flops 42 disposed parallel to latch data signals of 5 bits.

Data bits inputted from an input line 41 as two bits parallel data are sequentially delayed by the D-type flip-flop sections 42-1, 42-2, 42-3 and 42-4, and serial data of 4 clock cycles are converted to a parallel 7 bit data. Here, data bits having 2 bits which are to be converted to channel bits are outputted from the flip-flop section 42-3 as an output 43. One data bit preceding the data bits to be converted to channel bits is outputted from the flip-flop section 42-4 as LSB1. Four data bits following the data bits to be converted to channel bits are outputted from the flip-flop sections 42-1 and 42-2 parallelly. Therefore, data bits having total seven bits are inputted to the (1, 7) encoding ROM 45 via signal lines 44. Also, the (1, 7) encoding ROM 45 receives, via signal lines 47, ri bits having 2 bits from the D-type flip-flop section 49. The ri bits constitute a parameter which indicates whether the two data bits 43 to be converted to channel bits are first and second bits, third and fourth bits, or fifth and sixth bits in FIG. 1.

The (1, 7) encoding ROM 45 is a read only memory to realize the code conversion according to the table of FIG. 2. The (1, 7) encoding ROM 45 receives as inputs the ri bits comprising 2 bits, via the signal lines 47, and the above-mentioned data bits having 7 bits, via the signal lines 44, and outputs ro bits comprising 2 bits, via signal lines 46, and channel bits comprising 3 bits, via signal lines 48. These ro bits and channel bits are latched in the D-type flip-flop section 49 and only channel bits having 3 bits are outputted via signal lines 50. In practice, the channel bits outputted via the signal line 50 are, for example, parallel-serial converted by a circuit not shown in the drawing, and then NRZ/NRZI conversion is performed before recording, for example, onto an optical disc.

It should be noted that the (1, 7) encoding ROM 45 can be replaced with other circuit and the like, for example, a logic circuit which realizes the conversion operation according to the table of FIG. 2. Also, the encoding circuit of FIG. 4 can be realized by any equivalent means, such as a microcomputer and so on.

Figure 6:
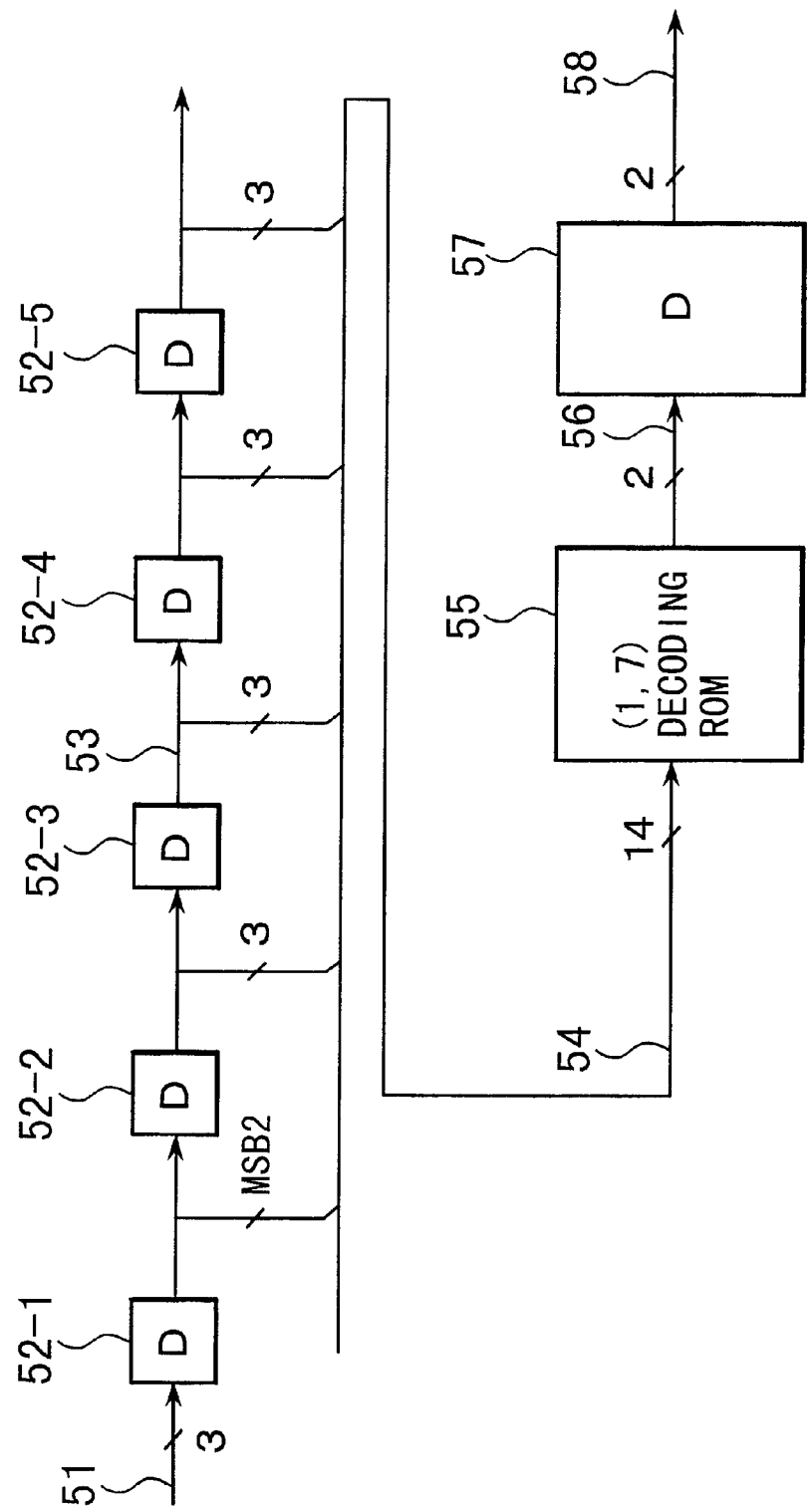
FIG. 6 is a block diagram showing an example of a structure of a (1, 7) decoding circuit.

FIG. 6 is a block circuit diagram illustrating an example of a structure of a (1, 7) decoding circuit for performing decode operation or reverse conversion according to FIG. 3.

The circuit of FIG. 6 comprises D-type flip-flop sections 52-1, 52-2, 52-3, 52-4 and 52-5 serially connected to constitute a serial-parallel conversion circuit. The circuit of FIG. 6 further comprises a (1, 7) decoding ROM 55 and another D-type flip-flop section 57. The (1, 7) decoding ROM 55 stores conversion data necessary to perform reverse conversion shown in FIG. 3.

Figure 7A:
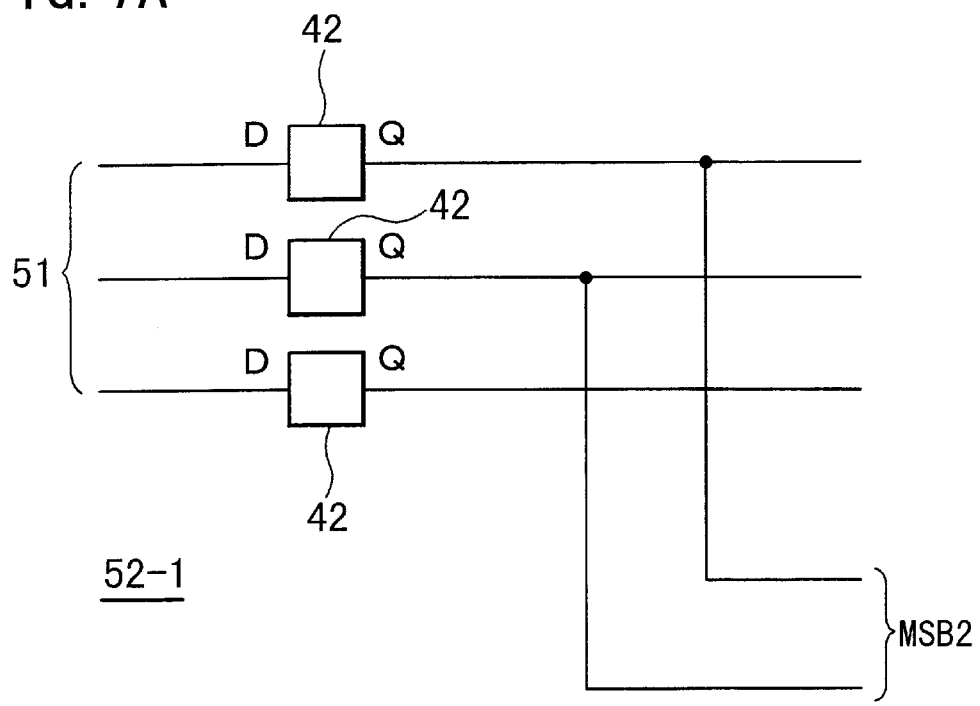
FIG. 7A and FIG. 7B are circuit diagrams each showing a detailed structure of a D-type flip-flop section used in the circuit of FIG. 6.
Figure 7B:
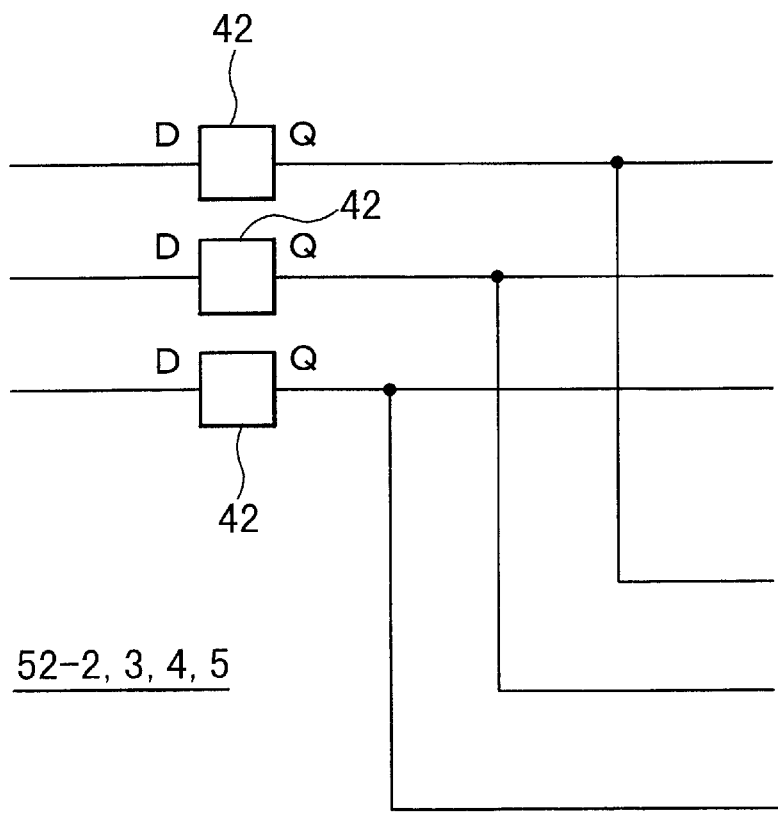

FIGS. 7A and 7B illustrate examples of detailed circuit structures of the D-type flip-flop sections used in the circuit of FIG. 6. As shown in FIG. 7B, each of the D-type flip-flop sections 52-2, 52-3, 52-4 and 52-5 comprises three D-type flip-flops 42 disposed parallel to handle 3 bits data. Each of the D-type flip-flops 42 receives an input signal at a data terminal D and latches the input signal based on a clock signal not shown in the drawing, as is well known in the art. The output signals from output terminals Q of the D-type flip-flops 42 are supplied to the D-type flip-flop section of the next stage and to the (1, 7) decoding ROM 55 via signal lines 54. As shown in FIG. 7A, the D-type flip-flop section 52-1 has the same structure as that of each of the D-type flip-flop sections 52-2, 52-3, 52-4 and 52-5, except that only two of the output signals from the three output terminals Q are supplied to the (1, 7) decoding ROM 55 as MSB2. The D-type flip-flop section 57 of FIG. 6 is composed of two D-type flip-flops 42 disposed parallel to latch data signals of 2 bits.

When, for example, channel bits recorded as mentioned above onto an optical disc and so on are reproduced, and if the channel bits are recorded using NRZI signal system, NRZI/NRZ conversion is performed on the reproduced channel bits and serial-parallel converted by circuits not shown to obtain channel bits having 3 bits parallel structure. The channel bits having 3 bits parallel structure are sequentially inputted from signal lines 51 to the circuit of FIG. 6.

Channel bits inputted from the signal lines 51 as three bit parallel data are sequentially delayed by the D-type flip-flop sections 52-1, 52-2, 52-3, 52-4 and 52-5, and channel bits for 5 clock cycles are converted to a parallel 14 bit data. Here, outputs from the flip-flop section 52-3 are used as channel bits having 3 bit parallel structure which are to be decoded into data bits. Six channel bits preceding the channel bits to be decoded to data bits are outputted from the flip-flop sections 52-4 and 52-5 in parallel. Five channel bits following the channel bits to be decoded to data bits are outputted from the flip-flop sections 52-1 and 52-2 in parallel. Therefore, channel bits having total 14 bits are inputted to the (1, 7) decoding ROM 55 via signal lines 54.

The (1, 7) decoding ROM 55 is a read only memory to realize the reverse conversion according to the table of FIG. 3. The (1, 7) decoding ROM 55 receives as inputs the abovementioned channel bits having 14 bits, via the signal lines 54, and outputs data bits comprising 2 bits, via signal lines 56. These data bits are latched in the D-type flip-flop section 57 and data bits having 2 bits are outputted via signal lines 58.

It should be noted that the (1, 7) decoding ROM 55 can be replaced with other circuit and the like, for example, a logic circuit which realizes the reverse conversion operation according to the table of FIG. 3. Also, the decoding circuit of FIG. 6 can be realized by any equivalent means, such as a microcomputer and so on.

FIG. 8 shows an example of a recording code conversion rule table used in another embodiment of the present invention. The recording code conversion rule table shown in FIG. 6 is composed of an ordinary conversion table and a special conversion table. The ordinary conversion table has 7 kinds of correspondence relations between data bits and channel bits. In the ordinary conversion table, channel bits exist only in a main conversion table, that is, table A.

The ordinary conversion table shows that data bits "00" is converted to channel bits "00X", and, similarly, "01" is converted to "010", "10" is converted to "10X", "1100" is converted to "000010", "1101" is converted to "00000X", "1110" is converted to "100010", "1111" is converted to "10000X". Here, symbol "X" designates an indefinite bit which becomes "1" when the next channel bit succeeding the indefinite bit is "0", and becomes "0" when the next channel bit succeeding the indefinite bit is "1".

The special conversion table is provided in the recording code conversion rule table to avoid long time continuation of the 2T patterns. In the special conversion table, to the data bits "100110", channel bits "000000010" (table A) or "100000010" (table B) are specially allotted. The data bits "100110" are converted to channel bits by selecting one of the tables A and B depending on a predetermined condition or criterion and by performing conversion in accordance with the content of the selected table. For example, when the table B is selected, the maximum number of repetition of the 2T patterns is limited to six (6).

Selection between the table A and the table B can be done based on any criterion. For example, the selection between the table A and the table B can be done such that DSV (Digital Sum Value) of the converted code becomes minimum to decrease DC signal component of a signal which is, for example, recorded on a recording medium. When the value "+1" is allotted corresponding to "H" (high potential level) of the signal recorded and the value "−1" is allotted corresponding to "L" (low potential level) of the signal, DSV designates an accumulative sum of these values. A code whose DSV converges on zero is called a DC free code. Because of the transmission characteristic of recording-reproducing system, it is usually preferable that the recording code is the DC free code. When the selection between the table A and the table B is performed so as to minimize DSV, there is a possibility that maximum 8 bits of "0" continue, and, in that case, maximum interval between signal inversions becomes 9T.

FIG. 9 shows an example of a recording code conversion rule table used in still another embodiment of the present invention. The recording code conversion rule table shown in FIG. 9 has 10 kinds of correspondence relations between data bits and channel bits. Among 10 kinds of correspondence relations, 9 kinds of correspondence relations have channel bits only in a main conversion table (table A), and remaining one kind of correspondence relation has channel bits both in the main conversion table (table A) and a sub conversion table (table B).

In the table of FIG. 9, data bits "00" are converted to channel bits "00X", and, similarly, "01" are converted to "010", "10" are converted to "10X", "1101" are converted to "00000X", "1110" are converted to "10000X". To data bits "1100", channel bits "000010" (table A) and "100010" (table B) are allotted. The data bits "1100" are converted to channel bits by selecting one of the tables A and B depending on a predetermined condition or criterion and by performing conversion in accordance with the content of the selected table.

Also, data bits "111100" are converted to channel bits "00000001", data bits "111101" are converted to channel bits "00000000X", data bits "111110" are converted to channel bits "100000010", and data bits "111111" are converted to channel bits "10000000X". Here, symbol "X" designates an indefinite bit which becomes "1" when the next channel bit succeeding the indefinite bit is "0", and becomes "0" when the next channel bit succeeding the indefinite bit is "1".

Selection between the table A and the table B can be done based on any criterion. For example, the selection between the table A and the table B can be done such that DSV of the converted code becomes minimum. When the selection between the table A and the table B is performed so as to minimize DSV, there is a possibility that maximum 10 bits of "0" continue, and, in that case, maximum interval between signal inversions becomes 11T.

FIG. 10 shows an example of a recording code conversion rule table used in still another embodiment of the present invention. The recording code conversion rule table shown in FIG. 10 is composed of an ordinary conversion table and a special conversion table. The ordinary conversion table has 7 kinds of correspondence relations between data bits and channel bits. In the ordinary conversion table, channel bits exist only in a main conversion table, that is, table A.

The ordinary conversion table shows that data bits "00" are converted to channel bits "00X", and, similarly, "01" are converted to "010", "10" are converted to "10X", "1100" are converted to "000010", "1101" are converted to "00000X", "1110" are converted to "100010", "1111" are converted to "10000X". Here, symbol "X" designates an indefinite bit which becomes "1" when the next channel bit succeeding the indefinite bit is "0", and becomes "0" when the next channel bit succeeding the indefinite bit is "1".

The special conversion table is provided in the recording code conversion rule table to avoid long time continuation of the 2T patterns. In the special conversion table, channel bits "000000010" (table A), "00000000X" (table B), "100000010" (table C) or "10000000X" (table D) are specially allotted to the data bits "100110". The data bits "100110" are converted to channel bits by selecting one of the tables A through D depending on the condition which is determined, for example, as mentioned below and by performing conversion in accordance with the content of the selected table. For example, when the table C is selected, the maximum number of repetition of the 2T patterns is limited to six (6).

Selection among the table A through table D can be done based on any predetermined condition or criterion. For example, the selection among the tables A through D can be done such that DSV (Digital Sum Value) of the converted code becomes minimum as mentioned above. When the selection among the tables A through D is performed so as to minimize DSV, there is a possibility that maximum 10 bits of "0" continue, and, in that case, maximum interval between signal inversions becomes 11T.

When the maximum interval between signal inversions becomes large, it becomes difficult to reliably extract a bit clock signal, for example, in a reproducing side of an optical disc storage, and there is a possibility that reliability of data reproduction is deteriorated due to the jitter of a reproduced signal. In order to avoid such disadvantage, it is also preferable to limit the length of the maximum interval between signal inversions within a predetermined value, and, among the tables satisfying such limitation, to select a table by which DSV can be minimized. For example, when the maximum interval between signal inversions is limited to a value equal to or smaller than 9T, it is necessary to limit the number of continuation of "0" within the maximum number of 8, that is, smaller than 9. Therefore, the table B is selected only when the preceding channel bit is "1" and the succeeding channel bit is "0".

Now, description will be made on insertion of synchronization signals into recording codes or channel bits encoded as mentioned above. When, for example, data is recorded on a recording medium or transmitted via a communication line, it is necessary to periodically insert synchronization signals into code signals to be recorded or transmitted. This is because, it is necessary to suppress erroneous transmission of data due to out of synchronization of PLL (phase-locked loop), used in a reproducing side, and the like.

It is preferable that the synchronization signals used in (1, 7) codes according to the present invention have the following characteristics.

i) In each of the synchronization signals, a pattern should be included which is a continuation of 8Ts patterns that does not appear in a usual data signal pattern, that is,

"1000000010000001".

ii) In order to satisfy the rule of having an interval equal to or larger than 2Ts and equal to or smaller than 8Ts at the connection point between the synchronization signal and channel bits following the synchronization signal, the synchronization signal ends with the following pattern:

"010"

iii) In order to satisfy the rule of having an interval equal to or larger than 2Ts and equal to or smaller than 8Ts at the connection point between the synchronization signal and channel bits immediately preceding the synchronization signal, the synchronization signal starts with the following pattern:

"010"

Considering these characteristics and assuming that each synchronization signal is composed of 24 bits, examples of synchronization patterns are considered to be as follows:

"0101 0010 0000 0010 0000 0010" (1)

"0100 1010 0000 0010 0000 0010" (2)

"0100 0010 0000 0010 0000 0010" (3)

"0100 1000 0000 1000 0000 1010" (4)

"0101 0000 0001 0000 0001 0010" (5)

"0100 0000 0100 0000 0101 0010" (6)

"0100 0000 0100 0000 0100 1010" (7)

"0100 0000 0100 0000 0100 0010" (8)

The synchronization signals having the above-mentioned various patterns can be used in many ways. For example, when a sector of data to be recorded onto a recording medium, such as an optical disc, has a plurality of synchronization signal blocks, each including data signal preceded by a synchronization signal, it is possible to determine from the synchronization signal the number, such as the sequence number, of a synchronization signal block in the sector of data, by inserting the synchronization signals having different patterns into the respective synchronization signal blocks.

For example, when a sector has 8N synchronization signal blocks, where N is a positive integer and n is an integer between 0 and N−1, the above-mentioned 8 kinds of synchronization signals (1) through (8) can be allotted as follows:

The synchronization signal (1) is used in (8n)th synchronization signal block.

The synchronization signal (2) is used in (8n+1)th synchronization signal block.

Similarly, the synchronization signals (3) through (7) are used in (8n+2)th through (8n+6)th synchronization signal blocks, respectively.

Finally, the synchronization signal (8) is used in (8n+7)th synchronization signal block.

Thus, by allotting different synchronization signals to the respective synchronization signal blocks in a sector, it is possible to surely determine the number of the synchronization signal block in the sector. Therefore, for example, when video or audio data reproduced from each synchronization signal block in an optical disc is written into a RAM (random access memory) according to an order of the synchronization signal blocks, it is possible to prevent the data from being written into wrong addresses. Consequently, collapse of a picture displayed by using the video data read from the RAM, or occurrence of click noises in an audio signal generated by using the audio data read from the RAM can be surely avoided.

Also, it is possible to make any of a plurality of predetermined kinds of the synchronization signals among the above-mentioned synchronization signals selectable and to select a synchronization signal such that DSV can be made smallest.

For example, among the above-mentioned synchronization signals, it is possible to make one synchronization signal selectable from a group of the following two kinds of synchronization signals, i.e., "0101 0010 0000 0010 0000 0010", and

"0100 0010 0000 0010 0000 0010", and to select one of these patterns by which DSV can be made smaller at the end portion of the synchronization signal block.

Also, it is possible to use a combination of a plurality of groups of synchronization signals. For example, it is possible to make one synchronization signal selectable from a group of the following two kinds of synchronization signals, i.e., "0101 0010 0000 0010 0000 0010", and
"0100 0010 0000 0010 0000 0010",
in even number of synchronization signal blocks, and to make one synchronization signal selectable from another group of the following two kinds of synchronization signals, i.e.,
"0100 0000 0100 0000 0100 1010", and
"0100 0000 0100 0000 0100 0010",
in odd number of synchronization signal blocks. In this constitution, one of the patterns by which DSV can be made smaller is selected at the end portion of each of the synchronization signal blocks.

Now, brief description will be made on the encoding of data bits into channel bits which channel-bits immediately precede a synchronization signal. There often occurs a situation in which only two bits of data bits to be encoded into channel bits remain before a location of a synchronization signal. In this case, it is often necessary to combine the two data bits with other bits which should exist at the location corresponding to the location of the synchronization signal to produce data bits equal to or longer than 4 bits, in order to make it possible to encode the two data bit into channel bits. For example, in FIG. 1, consider a case when partitioning of data bits for encoding is finished leaving two data bits immediately before a location of a synchronization signal, that is, when ro=0 in FIG. 2, and when the two data bits left are "11". In this case, the two data bits left can not be encoded into channel bits if the two data bits do not have succeeding two bits. In such case, in the present invention, encoding is performed by placing data bits "00" at the location corresponding to the location of the synchronization signal. That is, the encoding is performed on data bits "1100" to obtain channel bits "000010", and, among the obtained channel bits, only three bits "000" in the first half are used. Here, as mentioned above, the synchronization signal begins from start bits "010", a bit pattern "000010" is obtained by combining the three bits "000" in the first half and the start bits "010" of the synchronization signal. This bit pattern is the same as the above-mentioned channel bits obtained by encoding the data bits "1100".

As mentioned above, in a method for encoding recording codes according to the present invention, respective channel bits "00X", "010" and "10X" are allotted to 3 patterns of data bits among 4 pattern of data bits having 2 bits, channel bits "000010", "00000X", "100010" and "10000X" are allotted to 4 patterns of data bits having 4 bits which are a combination of two bits having a remaining one pattern among the 4 pattern of the data bits having 2 bits and additional two bits, and channel bits "100000010" as a special pattern are allotted to data bits having 6 bits which are the continuation of alternate 3 patterns of data bits to be encoded to channel bits "010" and data bits to be encoded to channel bits "10X". Therefore, in recording codes in which minimum interval between inversions is 2Ts, and maximum interval between inversions is 8Ts, number of continuation of "10" can be limited within a finite value. To this end, it is possible to maintain stable lock of a PLL circuit for any pattern of data bits.

Also, in another method for encoding recording codes according to the present invention, respective channel bits "00X", "010" and "10X" are allotted to 3 patterns of data bits among 4 pattern of data bits having 2 bits, channel bits "000010", "00000X", "100010" and "10000X" are allotted to 4 patterns of data bits having 4 bits which are a combination of two bits having a remaining one pattern among said 4 pattern of the data bits having 2 bits and additional two bits, and channel bits "000000010" or "100000010" as a special pattern are allotted to data bits having 6 bits which are the continuation of alternate 3 patterns of data bits to be encoded to channel bits "010" and data bits to be encoded to channel bits "10X", one of the channel bits "000000010" and "100000010" being selected according to a predetermined criterion. By this method, DC component of the recording codes can be effectively decreased and bad influence by signal jittering can be reduced.

Further, in a method for inserting synchronization signals according to the present invention, synchronization signals having different patterns are inserted into respective synchronization signal blocks of the plurality of synchronization signal blocks. Therefore, it is possible to surely determine the number of the synchronization signal block in a sector of recording codes.

Also, in another method for inserting synchronization signals according to the present invention, when a sector of recording codes comprises a plurality of synchronization signal blocks each including data signal and a synchronization signal, a plurality of synchronization signals having predetermined different patterns are prepared corresponding to each synchronization signal block, and, when a synchronization signal is inserted into a synchronization signal block, the synchronization signal is selected so as to minimize DSV of the synchronization signal block among the plurality of synchronization signals prepared for the synchronization signal block. Therefore, DC component of the recording codes can be decreased and bad influence by signal jittering can be reduced in addition to the advantageous effects of the method for inserting synchronization signals previously mentioned.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as falling within the scope of the appended claims.

What is claimed is:

1. A computerized method for encoding recording codes for machine storage or transmission of digital data signals wherein data bits are encoded into channel bits, comprising:

allotting respective channel bits "00X", "010" and "10X" to 3 patterns of data bits among 4 pattern of data bits having 2 bits, where X designates an indefinite bit which become "1" when the channel bit succeeding the indefinite bit is "0" and becomes "0" when the channel bit succeeding the indefinite bit is "1";

allotting channel bits "000010", "00000X", and "100010" and "10000X" to 4 pattern of data bits having 4 bits which are a combination of two bits having a remaining one pattern among said 4 pattern of said data bits having 2 bits and additional two bits;

allotting channel bits "100000010" as a special pattern to data bits having 6 bits which are the continuation of alternate 3 patterns of data bits to be encoded to channel bits "10" and data bits to be encoded to channel bits "10X"; and outputting electrical signals representing characteristics of said digital data signals.

2. A method for encoding recording codes as set forth in claim 1, wherein; when converting data bits having 2 bits into channel bits having 3 bits, data bits having 4 bits into channel bits having 6 bits and data bits having 6 bits into channel bits having 9 bits; from bit position flags indicating that 2 data bits to be encoded are the first 2 bits in the 2 bits or the 4 bits or the 6 bits, that data bits to be encoded are the two bits next to the first two bits in the 4 bits or the 6 bits, or that 2 data bits to be encoded are the last 2 bits in the 6 bits, data bits having 2 bits to be encoded, a data bit having 1 bit preceding said data bits to be encoded and data bits having 4 bits succeeding said data bits to be encoded; next bit position flags and encoded channel bits having 3 bits are obtained.

3. A method for decoding channel bits encoded by the method as set forth in claim 1, wherein; from channel bits to be decoded having 3 bits, channel bits having 6 bits preceding said channel bits to be decoded and channel bits having 5 bits succeeding said channel bits to be decoded; decoded data bits having 2 bits are obtained.

4. A computerized method for encoding recording codes for machine storage or transmission of digital data signals wherein data bits are encoded into channel bits, comprising:
   allotting respective channel bits "00X", "010" and "10X" to 3 patterns of data bits among 4 pattern of data bits having 2 bits, where X designates an indefinite bit which becomes "1" when the channel bit succeeding the indefinite bit is "0" and becomes "0" when the channel bit succeeding the indefinite bit is "1";
   allotting channel bits "000010", "00000X", and "100010" and "10000X" to 4 patterns of data bits having 4 bits which are a combination of two bits having a remaining one pattern among said 4 pattern of said data bits having 2 bits and additional two bits;
   allotting channel bits "000000010" or "100000010" as a special pattern to data bits having 6 bits which are the continuation of alternate 3 patterns of data bits to be encoded to channel bits "010" and data bits to be encoded to channel bits "10X", one of said channel bits "000000010" and "100000010" being selected according to a predetermined criterion; and
   outputting electrical signals representing characteristics of said digital data signals.

5. A method for encoding recording codes as set forth in claim 4, wherein, when selecting one of a plurality patterns of channel bits allotted to one kind of data bits, one pattern of channel bit is selected such that DSV (Digital Sum Value) of an encoded digital signal is minimized.

6. A method for encoding recording codes as set forth in claim 4, wherein, when selecting one of a plurality patterns of channel bits allotted to one kind of data bits, one pattern of channel bit is selected such that DSV (Digital Sum Value) of an encoded digital signal is minimized while satisfying limitation of maximum interval between inversions.

7. A computerized method for encoding recording codes for machine storage or transmission of digital data signals wherein data bits are encoded into channel bits, comprising:
   allotting respective channel bits "00X", "010" and "10X" to 3 patterns of data bits among 4 pattern of data bits having 2 bits, where X designates an indefinite bit which becomes "1" when the channel bit succeeding the indefinite bit is "0" and becomes "0" when the channel bit succeeding the indefinite bit is "1";
   allotting channel bits "000010" or "100010" to one of 4 pattern of data bits having 4 bits which are a combination of two bits having a remaining one pattern among said 4 pattern of said data bits having 2 bits and additional two bits, and one of said channel bits "000010" and "100010" being selected according to a predetermined criterion;
   allotting channel bits "00000X" and "10000X" to other two of said 4 pattern of data bits having 4 bits;
   allotting channel bits "000000010", "00000000X", "100000010" and "10000000X" to 4 patterns of data bits having 6 bits which are a combination of 4 bits having a remaining one pattern among said 4 pattern of said data bits having 4 bits and additional two bits; and
   outputting electrical signals representing characteristics of said digital data signals.

8. A method for encoding recording codes as set forth in claim 7, wherein, when selecting one of a plurality patterns of channel bits allotted to one kind of data bits, one pattern of channel bit is selected such that DSV (Digital Sum Value) of an encoded digital signal is minimized.

9. A method for encoding recording codes as set forth in claim 7, wherein, when selecting one of a plurality patterns of channel bits allotted to one kind of data bits, one pattern of channel bit is selected such that DSV (Digital Sum Value) of an encoded digital signal is minimized while satisfying limitation of maximum interval between inversions.

10. A computerized method for encoding recording codes for machine storage or transmission of digital data signals wherein data bits are encoded into channel bits, comprising:
    allotting respective channel bits "00X", "010" and "10X" to patterns of data bits among 4 pattern of data bits having 2 bits, where X designates an indefinite bit which becomes "1" when the channel bit succeeding the indefinite bit is "0" and becomes "0" when the channel bit succeeding the indefinite bit is "1";
    allotting channel bits "000010", "00000X", "100010" and "10000X" to 4 pat of data bits having 4 bits which are a combination of two bits having a remaining one pattern among said 4 pattern of said data bits having 2 bits and additional two bits;
    allotting channel bits "000000010", "00000000X", "100000010", or "10000000X" as a special pattern to data bits having 6 bits which are the continuation of alternate 3 patterns of data bits to be encoded to channel bits "010" and data bits to be encoded to channel bits "10X", one of said channel bits "000000010", "00000000X", "100000010" and "10000000X" being selected according to a predetermined criterion; and
    outputting electrical signals representing characteristics of said digital data signals.

11. A method for encoding recording codes as set forth in claim 10, wherein, when selecting one of a plurality patterns of channel bits allotted to one kind of data bits, one pattern of channel bit is selected such that DSV (Digital Sum Value) of an encoded digital signal is minimized.

12. A method for encoding recording codes as set forth in claim 10, wherein, when selecting one of a plurality patterns of channel bits allotted to one kind of data bits, one pattern of channel bit is selected such that DSV (Digital Sum Value) of an encoded digital signal is minimized while satisfying limitation of maximum interval between inversions.

13. A method for inserting synchronization signals into a series of data bits encoded by the method as set forth in claim 1, wherein a synchronization signal which includes a bit pattern "10000000100000001", which ends with "010" and which starts from "010" is inserted into said series of data bits.

14. A method for inserting synchronization signals as set forth in claim 13, wherein, when a sector of recording codes comprises a plurality of synchronization signal blocks each including data signal and a synchronization signal, synchronization signals having different patterns are inserted into respective synchronization signal blocks of said plurality of synchronization signal blocks.

15. A method for inserting synchronization signals as set forth in claim 13, wherein a plurality of synchronization signals having predetermined different patterns are prepared and, when a synchronization signal is inserted into a synchronization signal block, said synchronization signal is selected so as to minimize DSV of said synchronization signal block.

16. A method for inserting synchronization signals as set forth in claim 13, wherein, when a sector of recording codes comprises a plurality of synchronization signal blocks each including data signal and a synchronization signal, a plurality of synchronization signals having predetermined different patterns are prepared corresponding to each synchronization signal block, and, when a synchronization signal is inserted into a synchronization signal block, said synchronization signal is selected so as to minimize DSV of said synchronization signal block among said plurality of synchronization signals prepared for said synchronization signal block.

17. A method for encoding recording codes wherein a series of data bits into which synchronization signals are inserted in accordance with the method of claim 13 are encoded into channel bits, wherein, when it is necessary to combine data bits immediately before a synchronization signal with other bits existing at a location corresponding to a location of the synchronization signal to produce data bits equal to or longer than 4 bits in order to make it possible to encode the data bits into channel bits, encoding is performed by placing data bits "00" at the location corresponding to the location of the synchronization signal.

* * * * *

UNITED STATES PATENT AND TRADEMARK OFFICE
CERTIFICATE OF CORRECTION

PATENT NO.   : 6,477,209 B1
DATED        : November 5, 2002
INVENTOR(S)  : Itoi

It is certified that error appears in the above-identified patent and that said Letters Patent is hereby corrected as shown below:

Title page,
Item [30], Foreign Priority Data, "10-168856" should be -- 10-186856 --.

Column 14,
Line 55, "pattern" should be -- patterns --.
Line 62, "10" should be -- 010 --.

Column 15,
Lines 23, 32, 58, 64, and 66, "pattern" should be -- patterns --.

Column 16,
Line 28, "to patterns of data" should be -- to 3 patterns of data --.
Lines 4, 8, 28 and 36, "pattern" should be -- patterns --.
Line 34, "pat" should be -- patterns --.

Signed and Sealed this

Sixth Day of July, 2004

JON W. DUDAS
*Acting Director of the United States Patent and Trademark Office*